(12) United States Patent
Gogl et al.

(10) Patent No.: US 7,251,178 B2
(45) Date of Patent: Jul. 31, 2007

(54) CURRENT SENSE AMPLIFIER

(75) Inventors: Dietmar Gogl, Essex Junction, VT (US); Hans-Heinrich Viehmann, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/937,155

(22) Filed: Sep. 7, 2004

(65) Prior Publication Data

US 2006/0050584 A1 Mar. 9, 2006

(51) Int. Cl.
G11C 7/02 (2006.01)
G11C 11/00 (2006.01)

(52) U.S. Cl. .................. 365/209; 365/210; 365/158; 327/53

(58) Field of Classification Search ............. 365/205, 365/207, 208, 209, 210, 185.2, 185.21, 158, 365/171, 173; 327/53, 51
See application file for complete search history.

(56) References Cited

U.S. PATENT DOCUMENTS

| | | | |
|---|---|---|---|
| 5,663,915 A | 9/1997 | Mobley | |
| 5,694,363 A | 12/1997 | Calligaro et al. | |
| 5,929,658 A * | 7/1999 | Cheung et al. | 327/53 |
| 5,939,903 A | 8/1999 | Lin | |
| 6,191,989 B1 * | 2/2001 | Luk et al. | 365/207 |
| 6,259,644 B1 | 7/2001 | Tran et al. | |
| 6,269,040 B1 | 7/2001 | Reohr et al. | |
| 6,379,978 B2 | 4/2002 | Goebel et al. | |
| 6,385,079 B1 | 5/2002 | Tran | |
| 6,400,607 B1 | 6/2002 | Pasotti et al. | |
| 6,456,525 B1 | 9/2002 | Perner et al. | |
| 6,466,059 B1 | 10/2002 | Gaibotti et al. | |
| 6,469,937 B2 * | 10/2002 | Fuchigami et al. | 365/207 |

(Continued)

FOREIGN PATENT DOCUMENTS

EP 0 936 627 A1 8/1999

(Continued)

OTHER PUBLICATIONS

Fox, R.M., et al., "Leveraged Current Mirror Op Amp," Analog Integrated Circuits and Signal Processing, vol. 35, pp. 25-31, 2003, Kluwer Academic Publishers, The Netherlands.

(Continued)

Primary Examiner—Trong Phan
(74) Attorney, Agent, or Firm—Slater & Matsil, L.L.P.

(57) ABSTRACT

A high-speed current sense amplifier has complementary reference cells and load devices that eliminate capacitive mismatch contributions. The current sense amplifier includes a voltage comparator, a first clamping device coupled between a first input of the voltage comparator and a first input signal node. The first clamping device is coupled to a reference voltage. A second clamping device is coupled between the second input of the voltage comparator and a second input signal node. The second clamping device is also coupled to the reference voltage. A current mirror is coupled between the first and second input of the voltage comparator and is coupled to an active capacitance balancing circuit. The active capacitance balancing circuit may be combined with the voltage comparator. Equalization devices may be coupled between the first and second inputs of the voltage comparator, and between the first input signal node and the second input signal node.

28 Claims, 10 Drawing Sheets

U.S. PATENT DOCUMENTS

| | | |
|---|---|---|
| 6,473,336 B1 | 10/2002 | Nakajima et al. |
| 6,473,349 B1 | 10/2002 | Flannagan |
| 6,480,412 B1 | 11/2002 | Bessho et al. |
| 6,567,299 B2 | 5/2003 | Kunikiyo et al. |
| 6,574,129 B1 | 6/2003 | Tran |
| 6,608,787 B1 * | 8/2003 | Daga et al. .................. 327/53 |
| 6,678,189 B2 | 1/2004 | Tran |
| 6,683,807 B2 | 1/2004 | Hidaka |
| 6,700,814 B1 | 3/2004 | Nahas et al. |
| 6,798,250 B1 * | 9/2004 | Wile .......................... 327/53 |
| 6,946,882 B2 * | 9/2005 | Gogl et al. .................. 327/53 |
| 2003/0052844 A1 | 3/2003 | Fish et al. |
| 2004/0120200 A1 | 6/2004 | Gogl et al. |

FOREIGN PATENT DOCUMENTS

| | | | |
|---|---|---|---|
| WO | WO 02/29776 A1 | 4/2002 | |

OTHER PUBLICATIONS

Bette, A., et al., "A High-Speed 128Kbit MRAM Core for Future Universal Memory Applications," Symposium on VLSI Circuits Digest of Technical Papers, 2003, pp. 217-220.

Debrosse, J., et al., "A High-Speed 128-kb MRAM Core for Future Universal Memory Applications," IEEE Journal of Solid-State Circuits, Apr. 2004, pp. 678-683, vol. 39, No. 4.

* cited by examiner

CURRENT SENSE AMPLIFIER

CROSS-REFERENCE TO RELATED APPLICATIONS

This application relates to co-pending and commonly assigned patent application Ser. No. 10/326,367, filed Dec. 20, 2002, entitled "Current Sense Amplifier," which application is hereby incorporated herein by reference.

TECHNICAL FIELD

Embodiments of the present invention relate generally to semiconductor memory devices, and more particularly to sensing circuits for determining the resistive state of memory cells.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which uses a charge to store information.

Various memory types are commonly used to digitally store a substantial amount of data. DRAMs have moderate cost, are very fast and can have access times on the order of tens of nanoseconds, but lose the stored data upon loss of electrical power, i.e., they are "volatile." Present "flash" memories are non-volatile, are more expensive perhaps by a factor of ten, and have access times from tens of nanoseconds up to near a microsecond. Hard-disk drives are substantially lower in cost than DRAMs, are non-volatile, but have access times generally greater than a millisecond. Further application considerations for each technology include limitations on the number of times a memory cell can be written or read before it deteriorates, how long it reliably retains data, its data storage density, how much energy it consumes, the need for integral mechanical devices, and the complexity and expense of associated circuitry. Considering these limitations, there is now no ideal technology for general applications. Magnetic random access memory (MRAM) as described below appears to have properties that position it well for widely accepted digital memory applications, overcoming many of these limitations.

Spin electronics, which combines semiconductor technology and magnetics, is a relatively recent development in semiconductor memory devices. The spin of an electron, rather than the charge, is used to indicate the presence of a logic "1" or "0". One such spin electronic device is a resistive memory device referred to as a magnetic random access memory, which includes conductive lines positioned perpendicular to one another in different metal layers, the conductive lines sandwiching a magnetic stack which functions as a memory cell. The place where the conductive lines intersect is called a cross-point. A current flowing through one of the conductive lines generates a magnetic field around the conductive line and orients the magnetic polarity of one layer of the magnetic stack. A current flowing through the other conductive line induces a superimposed magnetic field and can partially turn the magnetic polarity, also. Digital information, represented as a "0" or "1", is storable in the alignment of magnetic moments in the magnetic stack. The resistance of the magnetic stack depends on the moment's alignment. The stored state is read from the magnetic stack by detecting the component's resistive state. An array of memory cells may be constructed by placing the conductive lines in a matrix structure having rows and columns, with the magnetic stack being placed at the intersection of the conductive lines.

A key advantage of MRAMs compared to traditional semiconductor memory devices, such as DRAMs, is that MRAMs are non-volatile upon removal of electrical power. This is advantageous because a personal computer (PC) utilizing MRAMs could be designed without a long "boot-up" time as with conventional PCs that utilize DRAMs, as an example.

FIG. 1 illustrates a magnetic tunnel junction (MTJ) stack that comprises a resistive or magnetic memory cell. The terms "memory cell" and "MTJ stack" are used interchangeably herein and refer to the MTJ shown in FIG. 1. The MTJ comprises two ferromagnetic layers M1 and M2 that are separated by a tunnel layer TL. The MTJ stack is positioned at the cross-point of two conductors, referred to as a wordline WL and a bitline BL. One magnetic layer M1 is referred to as a free layer, and the other magnetic layer M2 is referred to as a fixed layer. The magnetic orientation of the free layer M1 can be changed by the superposition of the magnetic fields caused by programming current $I_{BL}$ that is run through the bitline BL and the programming current $I_{WL}$ that is run through the wordline WL. A bit, e.g., a "0" or "1", may be stored in the MTJ stack by changing the orientation of the free magnetic layer relative to the fixed magnetic layer. If both magnetic layers M1 and M2 have the same orientation, the MTJ stack has a low resistance $R_C$. The resistance $R_C$ is higher if the magnetic layers have opposite magnetic orientations.

FIG. 2 illustrates an MRAM memory device 10 having a select transistor X1. In some MRAM memory array designs, the MTJ stack is combined with a select transistor X1, as shown in FIG. 2, which is a cross-sectional view of a 1T1MTJ design (one transistor and one MTJ stack). The 1T1MTJ design uses the select transistor X1 for selection and fast access of the MTJ during a read operation. A schematic diagram of the MTJ stack and select transistor X1 is shown in FIG. 3. As shown in FIG. 2, a bitline BL is coupled to one side of the MTJ stack, and the other side of the MTJ stack is coupled to the drain D of the select transistor X1 by metal layer MX, via VX, and a plurality of other metal and via layers, as shown. The source S of the transistor X1 is coupled to ground (GND). X1 may comprise two parallel transistors that function as one transistor, as shown in FIG. 2. Alternatively, X1 may comprise a single transistor, for example. The gate G of the transistor X1 is coupled to a read wordline (RWL), shown in phantom, that is preferably positioned in a different direction than, e.g., perpendicular to, the bitline BL direction.

The select transistor X1 is used to access the memory cells MTJ. In a read (RD) operation during current sensing, a constant voltage is applied at the bitline BL. The select transistor X1 is switched on, e.g., by applying a voltage to the gate G by the read wordline RWL, and current then flows through the bitline BL, the magnetic tunnel junction MTJ, over the MX layer, down the metal and via stack, through the transistor drain D, and through the transistor X1 to ground GND. This current is then measured and is used to determine the resistance of the MTJ, thus determining the programming state of the MTJ. To read another cell in the array, the transistor X1 is switched off, and the select transistor of the other cell is switched on.

The programming or write operation is accomplished by programming the MTJ at the cross-points of the bitline BL and programming line or write wordline WWL using selective programming currents. For example, a first programming current $I_{BL}$ passed through the bitline BL causes a first magnetic field component in the MTJ stack. A second magnetic field component is created by a second programming current $I_{WL}$ that is passed through the write wordline WWL, which may run in the same direction as the read wordline RWL of the memory cell, for example. The superposition of the two magnetic fields at the MTJ produced by programming currents $I_{BL}$ and $I_{WL}$ causes the MTJ stack to be programmed. To program a particular memory cell in an array, typically a programming current is run through the write wordline WWL, which creates a magnetic field at all cells along that particular write wordline WWL. Then, a current is run through one of the bitlines, and the superimposed magnetic fields switch only the MTJ stack at the cross-point of the write wordline WWL and the selected bitline BL.

The resistance difference between programmed and unprogrammed MRAM memory cells is relatively small. For example, the MTJ may be in the order of a 10k ohm junction, and there is a change of about 30% in the resistance when a magnetic field is applied at the MTJ. This changes the sense value from 10k ohm to between about 6k to 8k ohm, e.g., 7k ohm. For other memory devices such as flash memory cells or static random access memory (SRAM) cells, there is a larger resistance difference between programmed and unprogrammed memory cells than in MRAMs. For example, if a flash cell is activated, the "on" resistance is about 5k ohms, and the "off" resistance is substantially infinite. While other types of memory cells substantially completely switch on or off, an MRAM cell only has a small change in the resistance value upon programming. This makes MRAM cell state sensing more difficult, especially for a very rapid current sensing process that may be required for a high-speed memory.

Either current sensing or voltage sensing of MTJ resistance can be used to detect the state of memory cells. DRAMs usually are sensed using voltage sensing, for example. In voltage sensing, the bitline is precharged, e.g., to 1 volt, with the memory cell not activated. When the memory cell is activated, the memory cell charges or discharges the bitline and changes the voltage of the bitline. However, in some types of memory cells, the memory cell is small, and the bitline length may be long, e.g., may extend the entire width of the chip. The memory cell may not be able to provide enough cell current to discharge or charge a large bitline capacity within a required time. This results in an excessive amount of time being required to read the memory cells. Therefore, voltage sensing is not a preferred choice of sensing scheme for some memory devices, such as MRAM devices, because of the need to alter charge in a parasitic capacitance by a changing voltage.

Current sensing may be used to detect a resistance change of resistive memory cells. Current sensing is the desired method of sensing the state of MRAM cells, for example. In current sensing, a voltage is applied to the bitline, and the bitline voltage is kept constant with a sense amplifier. The cell current is directly measured, with the cell current being dependent on the resistance of the memory cell being read. The use of current sensing reduces the capacitive load problem from long bitlines that may occur in voltage sensing because the voltage of the sensed lines is held constant, thereby avoiding altering charge in the different interconnection capacitances of different memory cells.

In MRAM device current sensing, a constant voltage is applied to the bitline, generally as a source follower, and the current change at the bitline due to the resistance change of the magnetic tunnel junction is measured. However, because the resistance difference between a programmed and unprogrammed cell is small in MRAM memory cells, the current difference sensed is also smaller than the current change from a flash or an SRAM (static RAM) cell, for example.

SUMMARY OF THE INVENTION

In one aspect, the present invention relates to the need to rapidly sense MTJ resistance by balancing capacitance only within the current-sensing circuit where substantial voltage changes occur as the result of sensing low-level signals so that substantially equal time constants are produced for critical input current measurements. With unequal internal time constants, brief transient voltages and induced circuit noise may corrupt the resistance measurement process, requiring a longer wait time for reliable MRAM cell state determination. Co-pending application Ser. No. 10/326,367 (2002-P-50075 US), which is incorporated herein by reference as if included in its entirety, is directed towards balanced circuit design approaches for a fast current sensing circuit and the use of added capacitive circuit elements to equalize current sensing time constants. However, the added capacitive circuit elements may require adjustment as a consequence of ordinary manufacturing process variations, for example, to maintain sufficiently accurate capacitive balancing for short wait time with reliable MRAM logic state determination. In response, the preferred embodiment provides an improved current sensing design for memory devices with more accurate current-sensing capacitance balance that is independent of process variations such as due to manufacturing variations or operating temperature, enabling the design and efficient manufacture of fast MTJ memory elements.

Embodiments of the present invention achieve technical advantages as a current sense amplifier that is particularly useful in sensing current in a memory cell such as a resistive memory device to determine its logic state. A limiting factor often preventing the rapid determination of the logic state of a memory device is disparate time constants associated with parallel signal paths coupled to a voltage comparator in the memory cell state sensing circuit. The disparate time constants generally result from asymmetry in the voltage comparator circuit that produces unequal parasitic capacitances that must be charged or discharged by small currents. This produces a need for unnecessarily long circuit delays before the state of the voltage comparator can be reliably assessed. The circuit asymmetry may also make the circuit unnecessarily susceptible to externally induced noise, introducing the need for further delays.

The straightforward addition of circuit capacitance to balance circuit asymmetry may be impractical because small variations, for example, in manufacturing processes related to one device may not similarly affect another device providing the added capacitance. Thus an unreduced circuit asymmetry may remain, still requiring a delay in assessing the state of the voltage comparator.

In an embodiment of the present invention, a capacitive load is actively balanced by including one or more devices in a current sense circuit that exhibit a capacitive property substantially identical to the circuit elements producing the capacitive imbalance, and establishing an operating condition for the one or more included devices that approximates an operating condition in the circuit elements producing the original capacitive imbalance. By this means, capacitive loads can be balanced independently, for example, of a manufacturing variation or an operating temperature. For example, thickness of a gate oxide layer can vary slightly from manufacturing run to manufacturing run, causing a variation in gate capacitance. But the gate oxide layer can be substantially identical in thickness and properties across transistors on the same die, especially across transistors proximally located. Precise matching of an operating condition may not be practically required to achieve substantial matching of circuit time constants.

In accordance with a preferred embodiment of the present invention a high-speed current sense amplifier including a voltage comparator having a first input, a second input and an output is disclosed. A first clamping device is coupled between the first input of the voltage comparator and a first input signal node. A second clamping device is coupled between the second input of the voltage comparator and a second input signal node. The first clamping device and the second clamping device are coupled to a reference voltage.

The current sense amplifier further includes a current mirror coupled between the first and second input of the voltage comparator configured to sense the logic state of a memory cell. The current mirror has a first side and a second side, the current mirror first side including a first transistor coupled between a voltage source and the first clamping device and the current mirror second side including a second transistor coupled between the voltage source and the second clamping device, the first and second transistor gates being coupled together, and the gate and drain of the first transistor being coupled together. Preferably, an optional first equalizing transistor is coupled between the inputs of the voltage comparator that is enabled to conduct when the memory device is not being read, but disabled to conduct with a short delay after connecting bitlines to sense the logic state of the memory cell. Preferably, an optional second equalizing transistor is coupled between the first input signal node and the second input signal node that is enabled to conduct when the memory device is not being read, but disabled to conduct with a short delay after connecting bitlines to sense the logic state of the memory cell.

The current sense amplifier further includes an actively balanced capacitive load for the current mirror. The actively balanced capacitive load comprises at least one scaled transistor coupled to the second side of the current mirror. Preferably, to actively balance the capacitive load, the at least one scaled transistor is scaled to the area of a transistor in the current mirror and an operating condition of the at least one scaled transistor is configured to approximate an operating condition in the current mirror. Preferably, the operating condition in the current mirror is a drain to source voltage. Preferably, the operating condition in the current mirror is approximated by coupling the drain of the scaled transistor to a voltage different from its source and gate terminals. Preferably, the drain of the at least one scaled transistor is coupled to a transistor diode circuit to approximate the operating condition in the current mirror. In a preferred embodiment the transistor diode circuit is enabled to conduct by a series switch. In a preferred embodiment, the transistors are field-effect transistors (FETs).

In accordance with another preferred embodiment of the present invention, complementary reference cells are coupled to a current sense amplifier to provide a current representing an average current of an MTJ memory cell storing either a "0" or a "1" logic state.

In accordance with a further preferred embodiment of the present invention, a current sense amplifier includes a first current mirror with two sides and a voltage comparator combined with an actively balanced capacitive load for the first current mirror. A first clamping device is coupled between the first input of the voltage comparator and a first input signal node. A second clamping device is coupled between the second input of the voltage comparator and a second input signal node. The first clamping device and the second clamping device are preferably coupled to a reference voltage. The first current mirror first side includes a first transistor coupled between a voltage source and the first clamping device and the current mirror second side includes a second transistor coupled between the voltage source and the second clamping device, the first and second transistor gates being coupled together, and the gate and drain of the first transistor being coupled together. The inputs to the voltage comparator combined with an actively balanced capacitive load are coupled to the two sides of the first current mirror. In a preferred embodiment, the voltage comparator combined with an actively balanced capacitive load includes two transistors configured as a second current mirror, the two transistors coupled to two voltage sensing transistors scaled to balance the capacitive loads of the first current mirror. A gate of the first voltage sensing transistor is coupled to a side of the first current mirror, and a gate of the second voltage sensing transistor is coupled to another side of the first current mirror. The two transistors configured as the second current mirror are preferably scaled to provide an operating condition for the two voltage sensing transistors that approximates an operating condition for the first and second transistors comprising the first current mirror. Preferably, the operating condition in the two voltage sensing transistors is a drain to source voltage. In a preferred embodiment, the two transistors configured as a second current mirror are enabled to conduct by a series switch. In another preferred embodiment, the drain of at least one voltage sensing transistor is coupled to a voltage source. In a preferred embodiment, the transistors are field-effect transistors (FETs).

Another embodiment of the present invention is a method of sensing current. The method may be used, for example, to sense current from memory cells of a memory device such as the one shown in FIG. 1, for example. The method includes providing a voltage comparator having a first input, a second input and an output. The method further includes providing a first transistor and a second transistor, providing a first input signal node input having a first voltage and a first current, clamping the first voltage (e.g., with a clamping device such as a source follower) and passing the first current to the first transistor. The method preferably includes configuring the first and second transistors as a current mirror. The method further includes providing a second input signal node input having a second voltage and a second current, clamping the second voltage (e.g., with a clamping device such as a source follower) and passing the second current to the second transistor, wherein the first input signal node input and second input signal node input comprise either a current from a selected memory cell or a current from a reference source. Preferably, the method includes averaging current from two reference cells to produce the reference source current. As is well understood in the art, in place of the current from a reference source, a current from a memory cell storing the opposite state of the selected memory cell can be employed for the first input signal node input or the second input signal node input. The method further includes mirroring the first or second current from the first or second transistor to the second or first transistor, and comparing the voltage across the first or second transistor to the voltage across the second or first transistor, causing the voltage difference between the voltage across the first transistor and the voltage across the second transistor to be amplified. The method further includes configuring an actively balanced capacitive load for the first and second transistors forming the current mirror. The method preferably includes scaling at least one balancing transistor coupled to the current mirror to balance current mirror capacitance. Preferably, the method includes scaling the balancing transistor coupled to the current mirror to the area of a transistor in the current mirror. Preferably, the method includes configuring the operating conditions of the at least one scaled balancing transistor to approximate operating conditions in the current mirror. The method preferably includes coupling the drain of the at least one scaled balancing transistor to a transistor diode circuit to approximate an operating condition in the current mirror. The method preferably includes employing field-effect transistors (FETs).

In the circuit descriptions hereinabove and below, a transistor may be configured as multiple transistors coupled in parallel, or vice versa, without departing from the scope of the present invention.

Embodiments of the present invention achieve technical advantages as a current sense amplifier and memory device having a current mirror with actively balanced capacitive loads. Advantages of embodiments of the present invention include increased performance and speed in reading information stored in a memory device.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
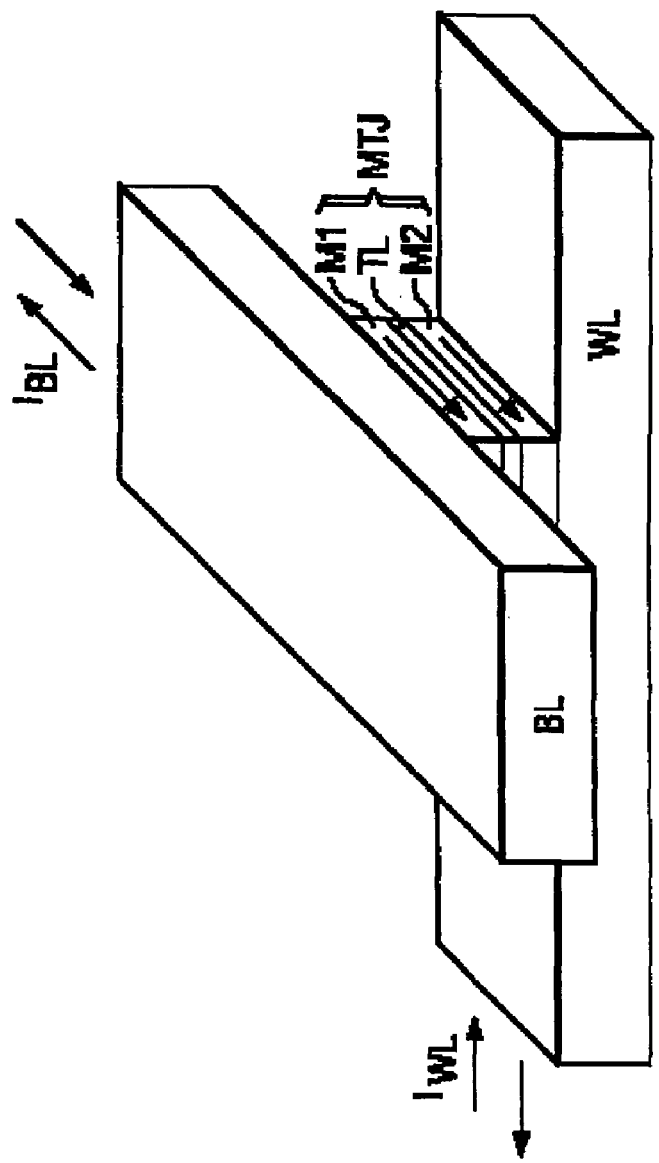
FIG. 1 shows a perspective view of an MTJ stack.
Figure 2:
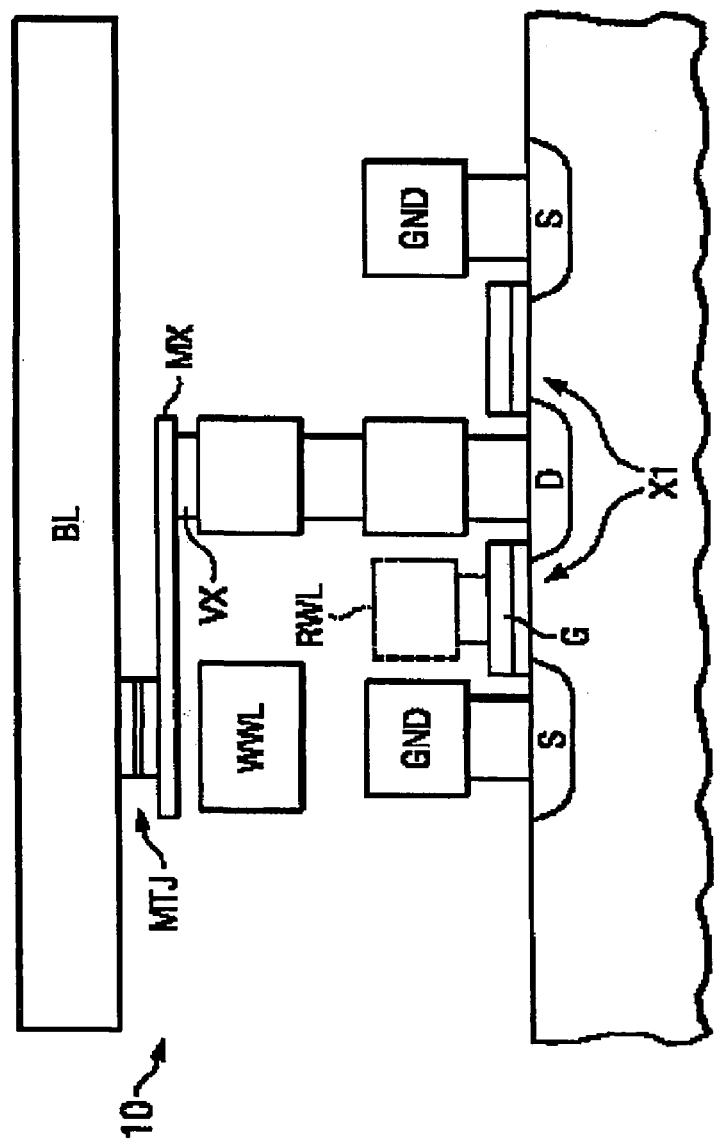
FIG. 2 shows a cross-sectional view of an MRAM memory device having a select FET.
Figure 3:
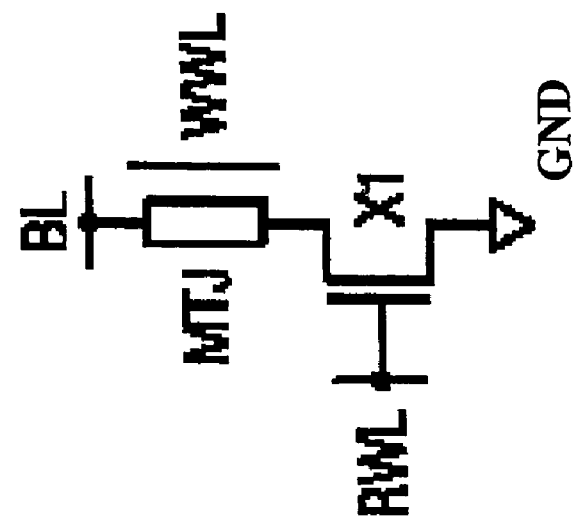
FIG. 3 is a schematic diagram of the memory device shown in FIG. 2.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention will be described with respect to preferred embodiments in a specific context, namely a FET MRAM device. The invention may also be applied, however, to resistive memory devices and other memory devices that use a current sense amplifier to detect the resistive state of memory cells. The current sense amplifier is also applicable in other applications where an unknown current is compared to a reference current in order to read or sense the unknown current.

In resistive memory devices such as MRAMs, current sensing circuits may be either asymmetric or symmetric. An asymmetric sense amplifier scheme 11 is shown in the prior art drawing of FIG. 4a. Shown is an example for a current sensing scheme 11 for a 1T1MTJ memory cell using averaging of reference cells $RC_1$ and $RC_2$ to produce a reference current at the inverting input of the current sense amplifier 12. The current sensing scheme 11 comprises a current sense amplifier 12 and a column selector 14 coupled to a memory array 16. The FETs illustrated on FIG. 4a are N-channel devices.

Only one memory cell 10 is shown; however, there may be hundreds or thousands or more memory cells in the array 16. The reference cells $RC_1$ and $RC_2$ preferably reside in the array with the memory cells 10, but the reference cells $RC_1$ and $RC_2$ may alternatively reside in another array 16, for example. Reference cell $RC_1$ may comprise a cell programmed as a logic 1, and reference cell $RC_2$ may comprise a cell programmed as a logic 0, for example. Each bitline BL containing a memory cell 10 is connected to at least one column select transistor X2 of the column selector 14. The column selector 14 is connected to the sense amplifier 12. The bitline clamp transistor X3, a source follower with its gate coupled to the bitline (BL) clamp voltage, is coupled to a multiplexer (not shown) that is coupled to a plurality of other memory cells, each via a column select transistor (also not shown). Cell 10, $RC_1$ and $RC_2$ are located on bitlines selected by the column selector 14. These cells are shown as examples for cells on the bitlines. Source follower X3 clamps the memory cell voltage to the BL clamp voltage minus approximately its FET threshold voltage. Memory cell voltage during a read operation is typically about 200-300 mV for an MRAM operating from a 1.8 V bias voltage source (not shown).

Figure 4A:
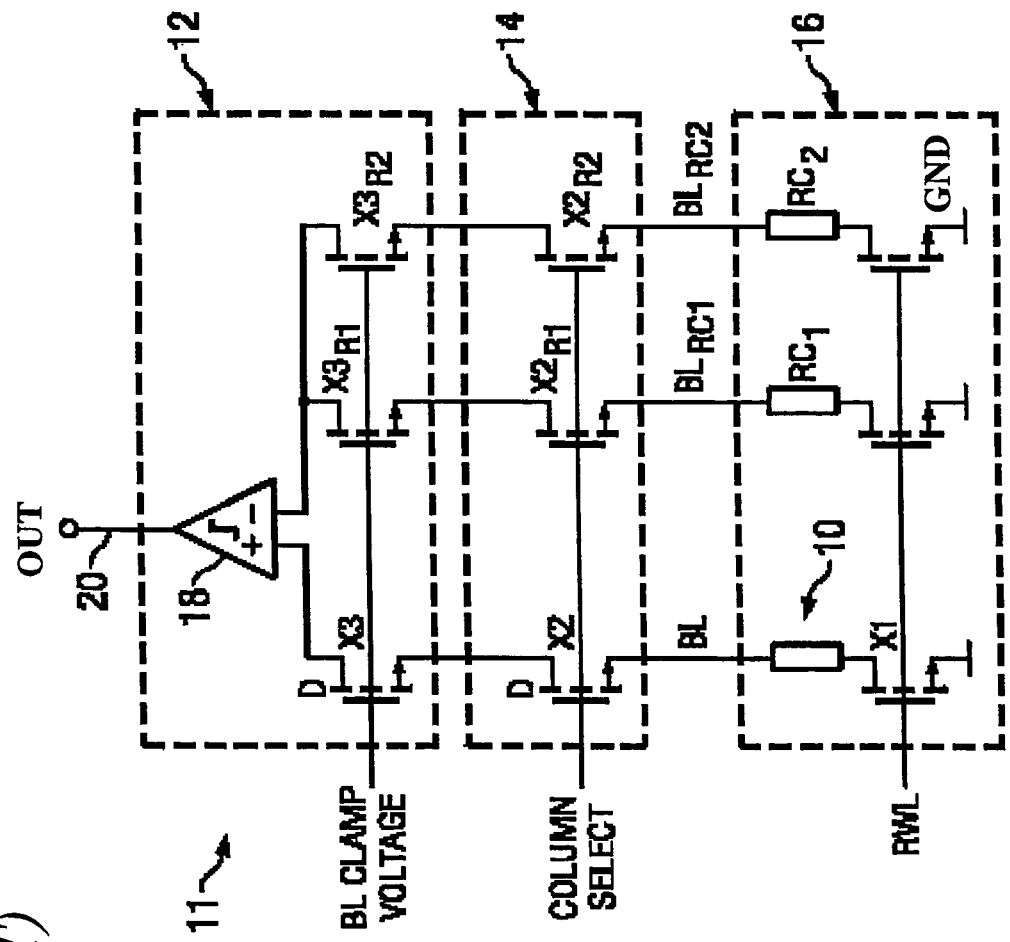
FIG. 4a is a schematic of an asymmetric sensing circuit that averages the current of two reference cells.

As current sensing is used in FIG. 4a, the selected bitlines are kept at a constant potential by bitline clamping transistors X3 during the read operation. The current comparator 18 compares the currents of the selected memory cell 10 with the averaged current of reference cells $RC_1$ and $RC_2$, with current scaling as required to form the averaged current. The level of the reference cell current is arranged to produce the approximate midpoint between the current of a selected cell with a logic "0" state and a selected cell with a logic "1" state, in MRAM applications. Alternatively, the current sense amplifier 12 may use only one reference cell, not shown, in other applications.

A read wordline RWL is coupled to the gate of the select transistor X1 of the selected cell 10. If the read wordline RWL is activated, then all of the select transistors X1 in that row of the memory array 16 are switched on. The column select transistor X2 of the column selector 14 is used to select the correct bitline BL (e.g., the column of the selected memory cell 10). The column selector 14 switches the bitline BL of the selected cell to the direction of the sense amplifier 12. The current sense amplifier 12 reads the resistive state of the selected cell 10 by measuring the current. The current sense amplifier 12 comprises a current comparator 18 coupled to transistor X3 and transistors $X3_{R1}$ and $X3_{R2}$ of the reference paths for reference cells $RC_1$ and $RC_2$. The current sense amplifier 12 maintains a constant bitline BL voltage during a read operation, using the source-follower clamping transistors X3, $X3_{R1}$ and $X3_{R2}$ that are coupled to the signal "BL clamp voltage." The current comparator 18 compares the current through transistor X3 of the selected cell 10 with the average of the currents through $X3_{R1}$ and $X3_{R2}$ of the reference cells, to determine the resistive state of selected cell 10, which information is output (indicated by "OUT") as a digital or logic "1" or "0" at node 20 of the current sense amplifier 12.

The current-sensing scheme 11 shown in FIG. 4a is disadvantageous in that it has an asymmetric structure, particularly for low-level signals. Two bitlines for only two reference cells $RC_1$ and $RC_2$ and column selector switches $X2_{R1}$, $X2_{R2}$ are connected to the right side (the inverting input) of the comparator 18, while only one bitline and a large number of column selector switches X2 are connected to the left side (the non-inverting input) of the current comparator 18 of the current sense amplifier 12. For example, there may be one out of 64 bitlines of memory cells 10 coupled to the non-inverting input of the current comparator 18, and two bitlines for reference cells coupled to the inverting input of the current comparator 18. Because of this asymmetry, the capacitive load of the sensing path at the non-inverting input of the current comparator 18 is much different from the capacitive load of the reference path at the inverting input of the current comparator 18. The capacitive load comprises capacitance of the switching transistors X3, $X3_{R1}$ and $X3_{R2}$, and the metal lines capacitively loaded by the memory cells, e.g., the bitlines BL. This makes the circuit sensitive to noise sources coupled into the circuit during sensing, such as power supply noise, internal asymmetric coupling of switching noise, as examples, and also increases the sensing time, particularly because of different RC time constants of the sensing paths for the selected memory cell and reference cells. Mismatches of circuit characteristics in the sensing path of an MRAM memory device, particularly for low-level signals, tend to be the main performance limiters for the array read access time.

Figure 4B:
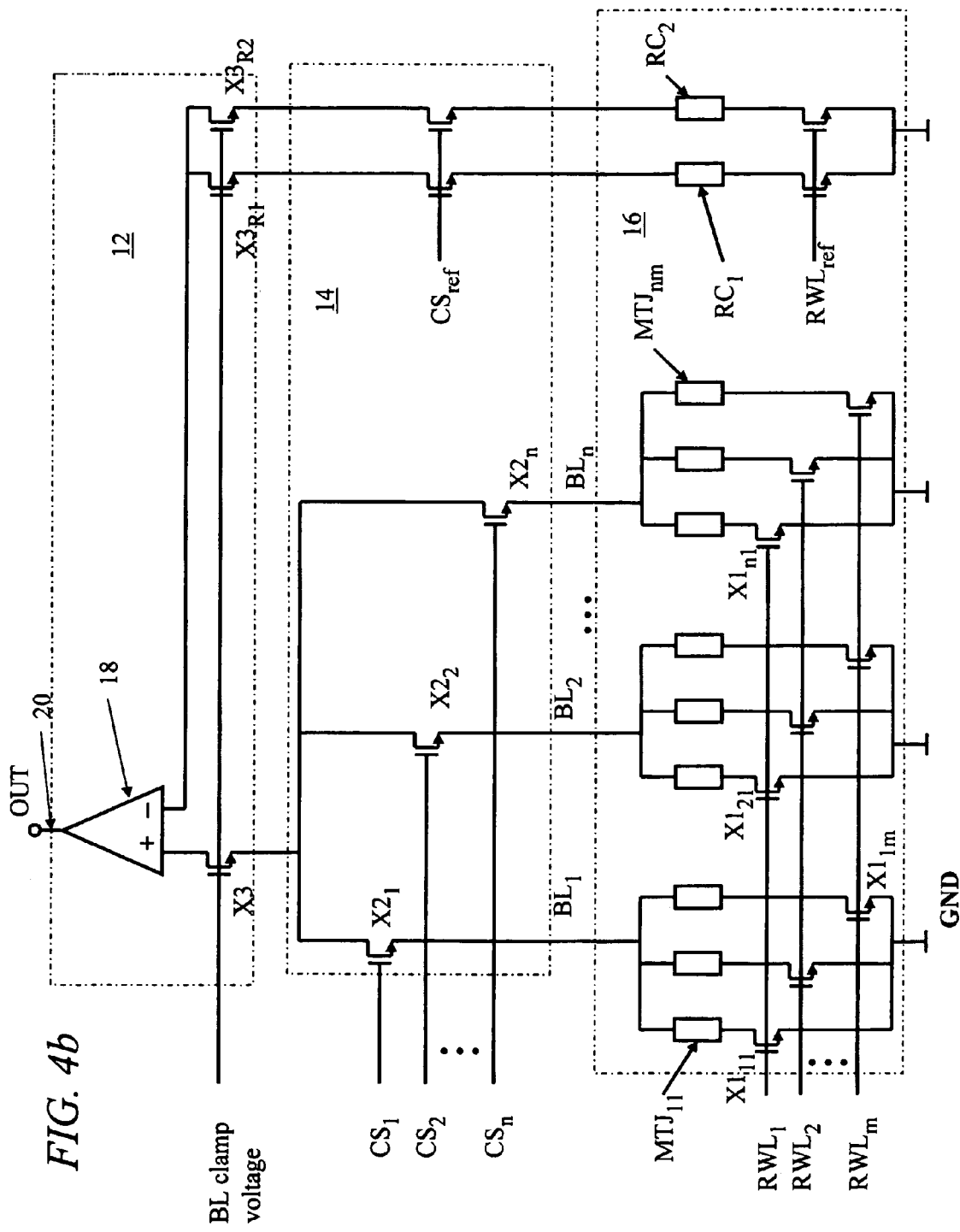
FIG. 4b is a schematic of an array of memory cells and two reference cells coupled to a current sensing circuit.

Referring now to FIG. 4b, illustrated is an array of memory cells $MTJ_{11}$ . . . $MTJ_{nm}$ in accordance with an embodiment of the present invention. Components that are the same as those illustrated on FIG. 4a will not be re-described in the interest of brevity, for example the current sense amplifier 12, column selector 14 and memory array 16. The current comparator 18 includes a non-inverting and an inverting input, and an output node 20 that indicates a logic state of a selected memory cell. Source followers X3, $X3_{R1}$, and $X3_{R2}$ clamp the voltage of the selected memory cell and the voltage of the two reference cells $RC_1$ and $RC_2$.

The memory cell to be sensed is determined by a memory cell address supplied from an external source (not shown) that is decoded to enable one of column select signals CS1, . . . , CSn and one of read wordline signals $RWL_1$, . . . , $RWL_m$. The switches $RWL_{ref}$ are included to provide symmetry in the circuit for the reference cells $RC_1$ and $RC_2$. In an alternative configuration there may be as many reference switches $RWL_{ref1}$, . . . , $RWL_{refm}$ as wordline signals $RWL_1$, . . . , $RWL_m$, and these reference switches may be directly connected to the corresponding wordline signals $RWL_1$, . . . , $RWL_m$. The enabled column select signal in turn selects one of bitlines $BL_1$, . . . , $BL_n$. The plurality of wordlines may be physically arranged in parallel proximate one side of the memory cells. The plurality of bitlines may also be physically ranged in parallel, and proximate another side of the memory cells. Correspondingly, one of transistors $X2_1$, . . . , $X2_n$ and all transistors, $X1_{11}$, . . . , $X1_{n1}$ of a wordline are enabled to conduct, selecting thereby a particular memory cell to be sensed, for example, in wordline 1. Similarly, to select a particular memory cell to be sensed in wordline m, transistors $X1_{1m}$ and following transistors in wordline m are enabled to conduct, rather than transistors $X1_{11}$, . . . , $X1_{n1}$ of wordline 1. Logic circuits to convert a memory cell address to a particular column select signal and a particular read wordline signal are well known in the art and will not be described further.

A current sense amplifier including the current comparator 18, the column selector including switches $CS_1$, . . . , $CS_n$, and switches $CS_{ref}$, and the clamping circuit including source followers X3, $X3_{R1}$, and $X3_{R2}$ form a sensing circuit as described hereinabove with reference to FIG. 4a, and below with reference to FIGS. 6, 7, 8, and 9. Thus FIG. 4b illustrates an arrangement to sense a selected memory cell in an array of memory cells for comparison with the state of two reference cells using averaging of currents of the reference cells $RC_1$ and $RC_2$ to produce a reference current at the inverting input of the current comparator 18.

Figure 5:
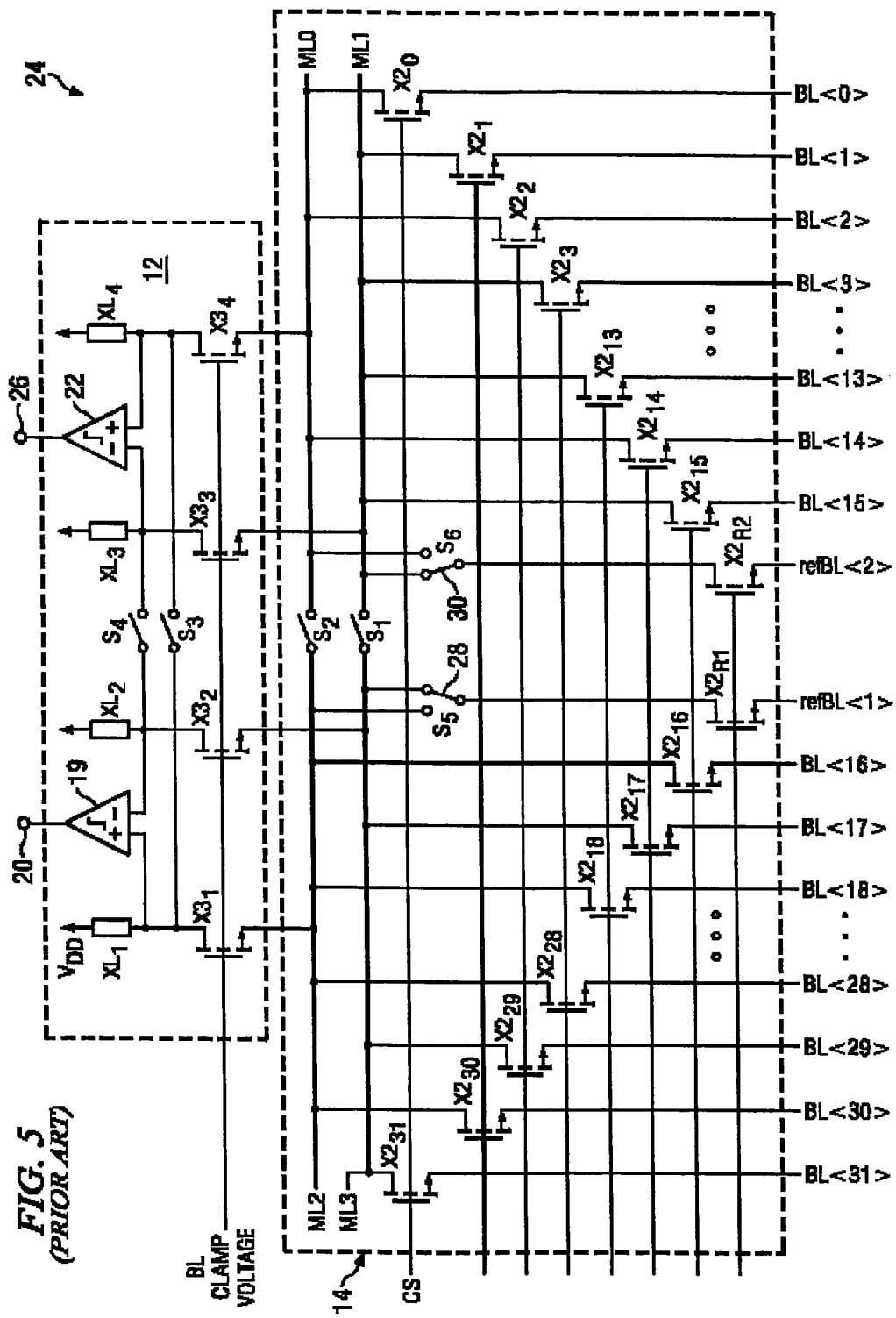
FIG. 5 is a schematic of a symmetric sensing circuit of the prior art having two differential amplifiers.

A symmetric sensing scheme or circuit 24 for MRAM FET memory devices of the prior art is shown in FIG. 5, which avoids some problems of the asymmetric sensing scheme 11 shown in FIG. 4a. With a symmetric sensing circuit 24 such as the one shown, the inputs of the comparators 19 and 22 have approximately equal effective capacitive loads. No matter which bitline is read, the wiring of the sensing path and effective capacitive load are approximately equal at each input, which reduces error voltages and noise. The reference path has twice the load of the sensing path, but the reference path is connected to two sense amplifier inputs (the inverting inputs of comparators 19 and 22). Therefore, the RC constants in both sense amplifier paths are substantially equal, and therefore the effective capacitive loads are substantially equal. The memory array 16 is not shown in FIG. 5; however, a memory array 16 is coupled to the column selector 14, as shown in FIG. 4a.

The current-sense amplifier 12 comprises a first and second voltage comparator 19 and 22, each having an output 20 and 26. The load devices $XL_1$, $XL_2$, $XL_3$, and $XL_4$ preferably comprise transistors configured as current sources, the load devices being the same type of devices (e.g., having the same load characteristics). Half of the select transistors $X2_{31}$, $X2_{30}$ . . . $X2_{16}$, $X2_{R1}$ (and corresponding memory cells 10 in the array 16) along the bitlines BL<31> through BL<16>, refBL<1> are coupled to the first voltage comparator 19, and the other half of the select transistors $X2_{R2}$, $X2_{15}$ . . . $X2_1$, $X2_0$ are coupled to a second voltage comparator 22. In this scheme 24, both sides of each current comparator 19 and 22 have substantially the same transient behavior because of the equal effective capacitive and resistive loads on the first and second voltage comparators 19 and 22. While 16 bitlines are shown on each side in FIG. 5, there may be more bitlines, e.g., 32 or 64, as examples.

For comparator 19, odd bitlines BL<31> through BL<17> are coupled to a masterline ML3 by corresponding column select transistors $X2_{31}$ through $X2_{17}$, and even bitlines BL<30> through BL<16> are coupled to a masterline ML2 by corresponding column select transistors $X2_{30}$ through $X2_{16}$. Similarly, for comparator 22, odd bitlines BL<15> through BL<1> are coupled to a masterline ML1 by corresponding column select transistors $X2_{15}$ through $X2_{1}$, and even bitlines BL<14> through BL<0> are coupled to a masterline ML0 by corresponding column select transistors $X2_{14}$ through $X2_{0}$. Therefore, the capacitive load of the bitlines is distributed half to the lower masterlines ML3 and ML1 and half to the upper masterlines ML0 and ML2. If an odd bitline is selected, the capacitive load is distributed to a lower masterline ML3 or ML1, for example. The reference bitlines refBL<1> and refBL<2> may be coupled either to the masterline ML3 or ML2, or ML1 or ML0, respectively (whichever is not being used by the selected cell), using switches $S_5$ and $S_6$, for example.

The selection of a memory cell at bitline BL<31> will be described next. Column select transistor $X2_{31}$ is switched on, which connects bitline BL<31> to the lower masterline ML3. The column select transistors $X2_{R1}$ and $X2_{R2}$ for the reference cells are switched on, and the connections 28 and 30 in switch $S_5$ and $S_6$, respectively, are made to the top masterlines ML2 and ML0. Switch $S_2$ between the top masterlines ML2 and ML0 is closed in order to average the reference cell currents. Switch $S_1$ between the two lower masterlines ML3 and ML1 remains open.

In the symmetric sense circuit 24 arrangement with odd and even bitlines being connected to two separate masterlines, the effective capacitive loads seen at the inputs of the voltage comparators 19 and 22 are substantially equal. In particular, the RC time constants of the sensing paths including masterline ML1 or ML3 are approximately equal to the RC time constants of the two sensing paths connected to the shorted masterline ML2/ML0. During a read operation, the lower masterlines ML1 and ML3 have eight transistors $X2_{31}$, $X2_{29}$ to $X2_{17}$ and $X2_{15}$, $X2_{13}$ to $X2_{1}$ and one bitline associated with the selected cell or reference cell, respectively, connected to them, and the top masterlines ML2 and ML0 have eight transistors $X2_{30}$, $X2_{28}$ to $X2_{16}$ and $X2_{14}$, $X2_{12}$ to $X2_{0}$ and one bitline associated with the selected cell or reference cell, respectively, connected to them. While the top masterlines ML2 and ML0 also have reference transistors $X2_{R1}$ and $X2_{R2}$ connected to them, this is not a significant difference in capacitance. So, the symmetric structure produces a considerably symmetric effective capacitive load at the inputs of the voltage comparators 19 and 22. Note that if a bitline is chosen that is connected to a lower masterline, the reference cells should be connected to an upper masterline. Similarly, if a bitline is chosen that is connected to an upper masterline, the reference cells should be connected to a lower masterline. The connection of the reference cells to the upper or lower masterlines ML2/ML0 or ML1/ML3 is made by switches $S_5$ and $S_6$.

Next, the averaging of the two reference cell currents will be described, with reference to the current sense amplifier 12 portion of the symmetric sense circuit 24 of FIG. 5. Assume for purposes of this discussion that the reference bitlines are connected to the bottom masterline ML1/ML3, and the selected cell bitline is connected to the top masterline ML2/ML0. The lower masterline switch $S_1$ connects the two reference bitlines refBL<1> and refBL<2> together. The voltage at the reference bitlines refBL<1> and refBL<2> is kept constant by the BL clamp (e.g., source follower) transistors $X3_2$ and $X3_3$. The reference current of the reference bitlines refBL<1> and refBL<2> is added due to the connection of the lower masterline switch $S_1$. The reference bitlines refBL<1> and refBL<2> current flows through the bitline clamping devices $X3_2$ and $X3_3$ and through load devices $XL_2$ and $XL_3$, respectively. The load devices $XL_1$, $XL_2$, $XL_3$, and $XL_4$ may preferably be transistor current sources to provide high gain in the current sense amplifier. The reference bitlines refBL<1> and refBL<2> current is added; it flows through two parallel resistors $XL_2$ and $XL_3$ from the bias voltage source $V_{DD}$. The selected cell is coupled to the top masterline ML2. Current from a selected cell (e.g., $X2_{28}$) flows through the BL clamping device $X3_1$ and through one load device, $XL_1$ coupled to the bias voltage source $V_{DD}$. The cell current causes a voltage shift at the load device $XL_1$, and the voltage comparator 19 detects this change in voltage at the load device $XL_1$. The load device $XL_1$ transforms the cell current into a voltage, according to the impedance characteristics of the load device.

To read a selected cell $X2_{28}$, cell current flows through the load device $XL_1$, is transformed to a voltage, and the voltage is seen by the non-inverting input of voltage comparator 19. At the inverting input, two load devices $XL_2$ and $XL_3$ are connected in parallel because switch $S_4$ is closed, so their total current rating is twice the current rating of load device $XL_1$. The currents of the 1 reference bitline and the 0 reference bitline added together are preferably twice the 0-and 1-bit averaged current of a regular memory cell. This current is fed into two load devices XL2 and $XL_3$ in parallel, which results in twice the current rating of a regular load device. Thus, the voltage that is created at the parallel connection of load devices $XL_2$ and $XL_3$ is the averaged voltage between a 1 and a 0 reference cell.

A problem with the symmetric sensing scheme is that sometimes the top masterline ML2 is used for the sensing path (when reading an even bitline), and other times the bottom masterline ML3 is used for the sensing path (when reading an odd bitline). When the bottom masterline ML3 is used for the sensing path, then the top masterline ML2 is used for the reference cells. In this case, switch $S_3$ is closed to connect load devices XL1 and $XL_4$ in parallel, and the current averaging is accomplished by the parallel combination of load devices $XL_1$ and $XL_4$. A disadvantage of this symmetric sensing structure is that a single sense amplifier cannot be used, because the averaging has to be accomplished sometimes using the bottom masterline and sometimes using the top masterline. Therefore, the structure requires two voltage comparators 19 and 22. The two voltage comparators 19 and 22 work together, achieving the averaging either using load devices $XL_1$ and $XL_4$ for the top masterline ML0 and ML2, or alternatively, using load devices $XL_2$ and $XL_3$ for the bottom masterline ML1 and ML3 in order to achieve the symmetric behavior of the sensing scheme 24.

In memory circuits there are many sources of noise, such as noise from power supplies, output buffers, or internal switching noise of the memory device itself, for example. In order to reduce the influence of these noise sources as much as possible and to reduce the effect of transient voltages introduced by the circuit, it is necessary to achieve the same RC time constants for the sensing paths from the selected bit lines to the sense amplifier 12 inputs, or to arrange the circuit with constant measurement voltages so that transients are not introduced by the charging and discharging of unequal capacitances. If voltage disturbances are introduced and there is an RC network, this will produce some transient voltage or current in the RC network. However, if the two RC networks at the voltage comparator inputs are identical, then these RC networks will have substantially the same transient responses, and the effect of the noise at the comparator inputs is thus reduced. The voltage comparators 19 and 22 then sense the same parasitic-induced response on both the non-inverting and inverting input, and they are affected much less by noise, because a significant amount of noise cancels out.

Therefore, for a symmetric sensing scheme 24, as shown in the example of FIG. 5, a sense amplifier with a symmetric sensing structure is needed in the art, to cancel or reduce potential noise and to achieve fast read times. If there is noise in the sense amplifier, it may take a longer amount of time to read data because it takes a while for the unwanted RC time constant effects to dissipate so that the data is valid. A symmetric sensing structure is needed that will reduce sensitivity to noise and thus permit faster read operations.

Embodiments of the present invention comprise a sense amplifier for use in current-sensing circuit arrangements that may be asymmetric, in circuit arrangements in which unequal RC time constants can introduce transients that delay a sensing operation, and in symmetric sense amplifier circuits such as the one shown in FIG. 5. A preferred embodiment of the invention is a current sense amplifier 70 (see FIG. 7) that can be configured to be used in a current-sensing or other signal-sensing arrangement, which is advantageous because high performance in MRAM memory devices may be achieved, even though the MRAM memory sensing signals are small.

Figure 6:
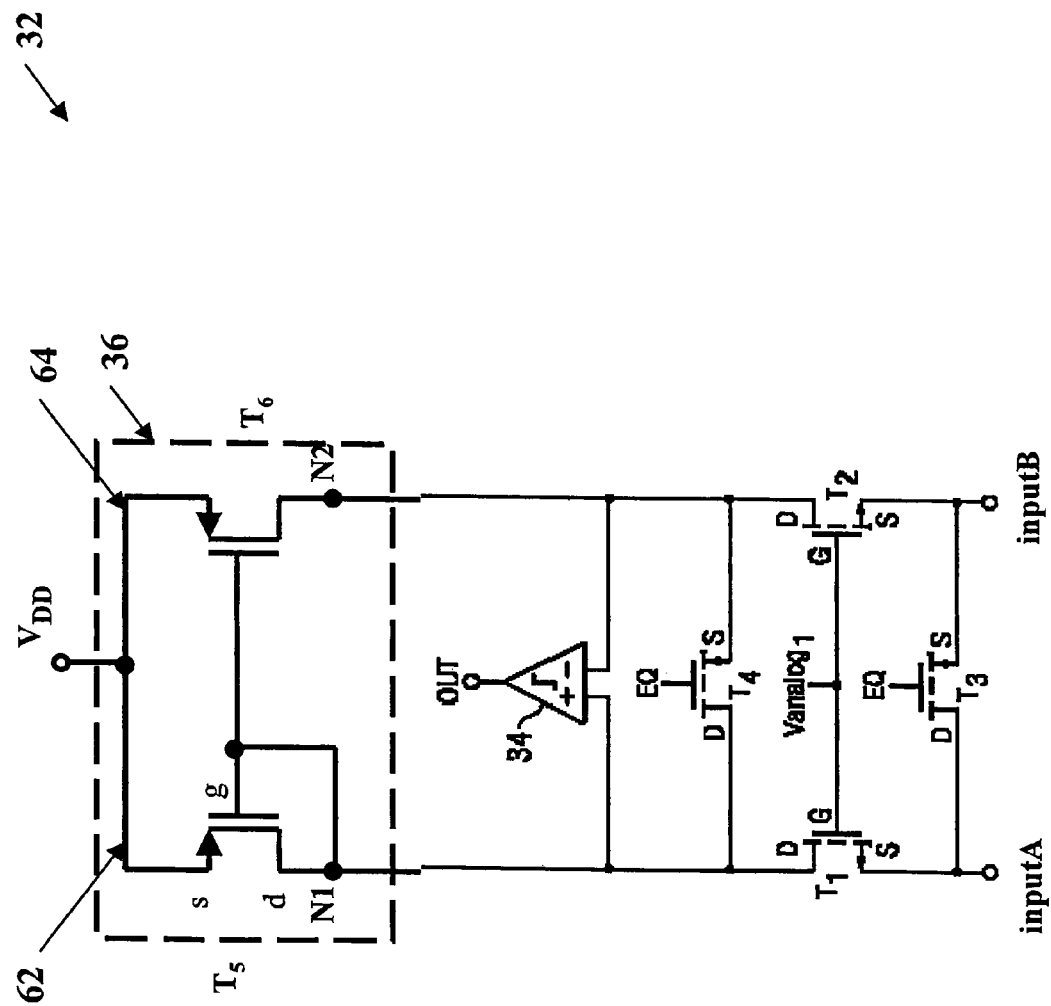
FIG. 6 shows a current sense amplifier that includes a voltage comparator, bitline clamping devices, and an illustrative current mirror with unbalanced capacitive load.

Referring now to FIG. 6, illustrated is a current sense amplifier 32 in accordance with an embodiment of the present invention that includes a voltage comparator 34. The drains of bitline clamping devices $T_1$ and $T_2$, which preferably comprise transistors, are coupled to the non-inverting and inverting inputs, respectively, of the voltage comparator 34. The sources of transistors $T_1$ and $T_2$ are connected to a first input signal node inputA and a second input signal node inputB, respectively, as shown. Assume that inputB is connected to the selected memory cell by a column selector signal (signal CS in FIG. 5), and that inputA is connected to reference cells producing an average mid-current reading of a "0" and "1" logic memory state. The reference cell current is input, for example, at inputA and is mirrored from transistor $T_5$, and creates a drain-source voltage at transistor $T_5$. Alternatively, inputA may be connected to a memory cell storing the opposite logic state of the selected memory cell. Clamping transistors $T_1$ and $T_2$ as illustrated on FIG. 6 are N-channel source followers, although other circuit arrangements and other transistor types may be used to clamp a memory cell voltage. The gates of transistors $T_1$ and $T_2$ are connected to a reference voltage $V_{analog1}$ that is preferably configured to provide a bitline clamp voltage as described hereinabove with reference to FIG. 4a. Reference voltage $V_{analog1}$ (corresponding to "BL clamp voltage" on FIG. 4a) may comprise a voltage level of about 0.7 volts to produce a memory cell voltage of about 200-300 mV, for example, considering FET threshold voltage, although reference voltage $V_{analog1}$ may alternatively comprise other voltage levels.

The current sense amplifier 32 may include optional transistor switches $T_3$ and $T_4$, which function as voltage equalizing devices. For example, the source of transistor $T_3$ may be coupled to signal inputB, the drain of transistor $T_3$ may be coupled to signal inputA, the source of transistor $T_4$ may be coupled to the inverting input of the voltage comparator 34, and the drain of transistor $T_4$ may be coupled to the non-inverting input of the voltage comparator 34. The gates of transistors $T_3$ and $T_4$ are coupled to an equalization signal EQ. Before a read operation is initiated, transistors $T_3$ and $T_4$ are activated to ensure that the input signal nodes, inputA and inputB, are at the same potential (i.e., equalized), and also to ensure that the inputs of the comparator 34 are equalized at the same potential. Transistors $T_3$ and $T_4$ are turned off after a short delay after the bitlines are connected and the memory cells are ready to be read. Connecting bitlines ordinarily causes some transient disturbance in the circuit.

Advantageously, the current sense amplifier 32 includes a current mirror 36 preferably comprised of P-channel transistors with drains coupled to the inputs of the voltage comparator 34. The current mirror includes a first transistor $T_5$ coupled between a bias voltage source $V_{DD}$ and clamping device $T_1$, and a second transistor $T_6$ coupled between the bias voltage source $V_{DD}$ and clamping device $T_2$. An exemplary voltage for the bias voltage source $V_{DD}$ is 1.8 volts, but lower (or higher) voltages may be used in future or other designs. The gates of transistors $T_5$ and $T_6$ are coupled together and to the drain of transistor $T_5$. The transistor $T_5$ is configured as a transistor diode. Transistor $T_6$ is thus configured as a transistor current source.

In a transistor diode configuration, if the gate of a transistor, e.g., transistor $T_5$, is connected to the drain, and a current is applied to the drain, then a voltage is developed between drain and source, and the transistor exhibits diode-like behavior. A current applied at inputA passes through the drain of transistor $T_5$, which is connected to the gate of transistor $T_5$, creating a voltage potential between the drain and source of transistor $T_5$. There is no ohmic, linear load, as in a resistor; rather, the behavior is somewhat similar to that of a diode, which exhibits a non-linear voltage-current characteristic.

On side 62, the drain-to-source voltage of transistor $T_1$ is determined by the current flowing into inputA and thus through transistor $T_5$. On side 64, the drain-to-source voltage of transistor $T_6$, which operates in current saturation with its gate voltage determined by transistor $T_5$, is greatly dependent on its drain-to-source current that, after an initial transient, must substantially equal the current at inputB. Thus, the steady-state drain-to-source current of transistor $T_6$ is substantially determined by the input current at inputB because transistors $T_3$ and $T_4$ are disabled to conduct during the MTJ measurement time. Thus, the unequal cell currents from inputA and inputB are converted to a large voltage difference that is coupled to the inputs of comparator 34, particularly by the drain-to-source voltage of transistor $T_6$. The voltage comparator 34 senses the substantial voltage difference resulting from the small difference of currents from inputA and inputB.

Thus if the inputB current is a little higher than the inputA current, a large voltage shift at the inverting input of the voltage comparator 36 is created because no substantial current flows into the input terminals of the voltage comparator 34. If additional current is applied at the drain of a transistor in current saturation, a small shift of this current creates a large shift in the drain-source voltage, resulting in a large voltage amplification. This amplified voltage is sensed by the inverting input of the voltage comparator 34. Thus, a large voltage difference is advantageously created between the inverting and non-inverting inputs of the voltage comparator 34, even when the current difference between inputA and inputB is small.

Preferably, transistors $T_5$ and $T_6$ have the same dimensions, the same geometry and the same orientation, and comprise the same type of transistors. Moreover, as is well understood in the art, the currents in a current mirror may be scaled as may be required for a particular circuit design by scaling the areas of the respective transistors to produce a scaled current mirror leg current. Preferably, the operating conditions of both transistors $T_5$ and $T_6$ should be similar (or scaled) to achieve ideal (or scaled) current mirroring performance.

Transistors $T_5$ and $T_6$ thus amplify the voltage difference at the first and second input, inputA and inputB, of the voltage comparator 34 producing a substantial output voltages at the node "OUT" representing a logic state of the selected memory cell. Thus small differences in currents can be detected in the sides 62 and 64 of the current sense amplifier due to small changes in memory cell resistance as it depends on the state of the memory cell. Transistors $T_5$, $T_6$, preferably comprise PMOS transistors, and alternatively may comprise NMOS transistors, as examples. Optional equalization switches $T_3$ and T4 may be included in the current sense amplifier and placed directly at inputA and inputB and at the non-inverting and inverting inputs of the comparator stage 34 of the sense amplifier 32.

Thus the current sense circuit illustrated in FIG. 6 is configured to apply equal voltages to the memory cells by means of the clamp transistors, thereby avoiding altering the charge of unknown parasitic capacitance, and to provide high sensitivity to small changes in the sensed resistance of a memory cell by means of a current mirror coupled to the drains of the source follower clamps.

The accuracy of the current mirror 36 illustrated in FIG. 6 may be improved by stacking an additional, optional cascode device in series with transistor $T_6$. The co-pending application Ser. No. 10/326,367 (the '367 application), as previously referenced and incorporated herein, describes circuit techniques to include a cascode device with the current mirror. A cascode device may be included in the circuit to establish similar operating conditions in the current mirror transistors on both sides thereof, thereby improving its accuracy and capacitive behavior. Thus, a sense amplifier including a cascode device can provide current-sensing speed advantages.

Referring further to FIG. 6, a capacitive load asymmetry within the current sense amplifier 32 will now be described. Within the current mirror consisting of transistors $T_5$ and $T_6$, with transistor $T_5$ configured as a transistor diode, the capacitive load at the drain of $T_5$ (node N1) comprises the load due to the drain of $T_5$, the gate of transistor $T_5$, and the gate load of transistor $T_6$. The capacitive load at the drain of $T_6$ (node N2) only comprises the load due to the drain of $T_6$. Therefore, even though the circuit has been desensitized to asymmetries in capacitance by voltage clamping at the current inputs, inputA and inputB, there remains an asymmetry of capacitance in a voltage-varying circuit within the current mirror 36.

During a sensing cycle, the comparator 34 input nodes (e.g., the non-inverting and inverting inputs, nodes N1 and N2, respectively) move towards their final value. If the two nodes have different capacitance, then the more lightly loaded side will move more quickly, creating an unwanted different signal than that appearing at the other input, leading to a longer required delay in reading the true signal and hence a slower access time. A current mirror load is, by design, mismatched in capacitance in that one side includes the gate capacitance of both devices while the other side effectively includes no gate capacitance. This effect can become quite noticeable, especially if device sizes are increased in an effort to reduce mismatch between the two devices.

One solution to the problem of unequal capacitance at the comparator inputs is described in the co-pending '367 application with reference to FIG. 12 therein. In that application, capacitive loads at the inputs of the voltage comparator 34 are matched by including at least one dummy capacitive device on the side of the comparator that has no or less gate capacitance, the at least one dummy capacitive device representing two dummy gates preferably with the same capacitance as the current mirror devices $T_5$ and $T_6$ illustrated in FIG. 6 of the present application. The added capacitive device, which may comprise at least one transistor with drain and source coupled to a low-impedance point of the circuit, or at least one capacitor, is coupled across the drain and source of transistor $T_6$ of the current mirror to balance the capacitive loads of the current mirror. This solution, while providing substantial improvement to the transient response of a current sensing circuit, can benefit from further accuracy improvement in capacitive load balancing because variations in manufacturing processes and components as well as dissimilar operating points of an added transistor can require adjustments or corrections to an added circuit element to achieve the best transient performance, thereby adding cost.

Figure 7:
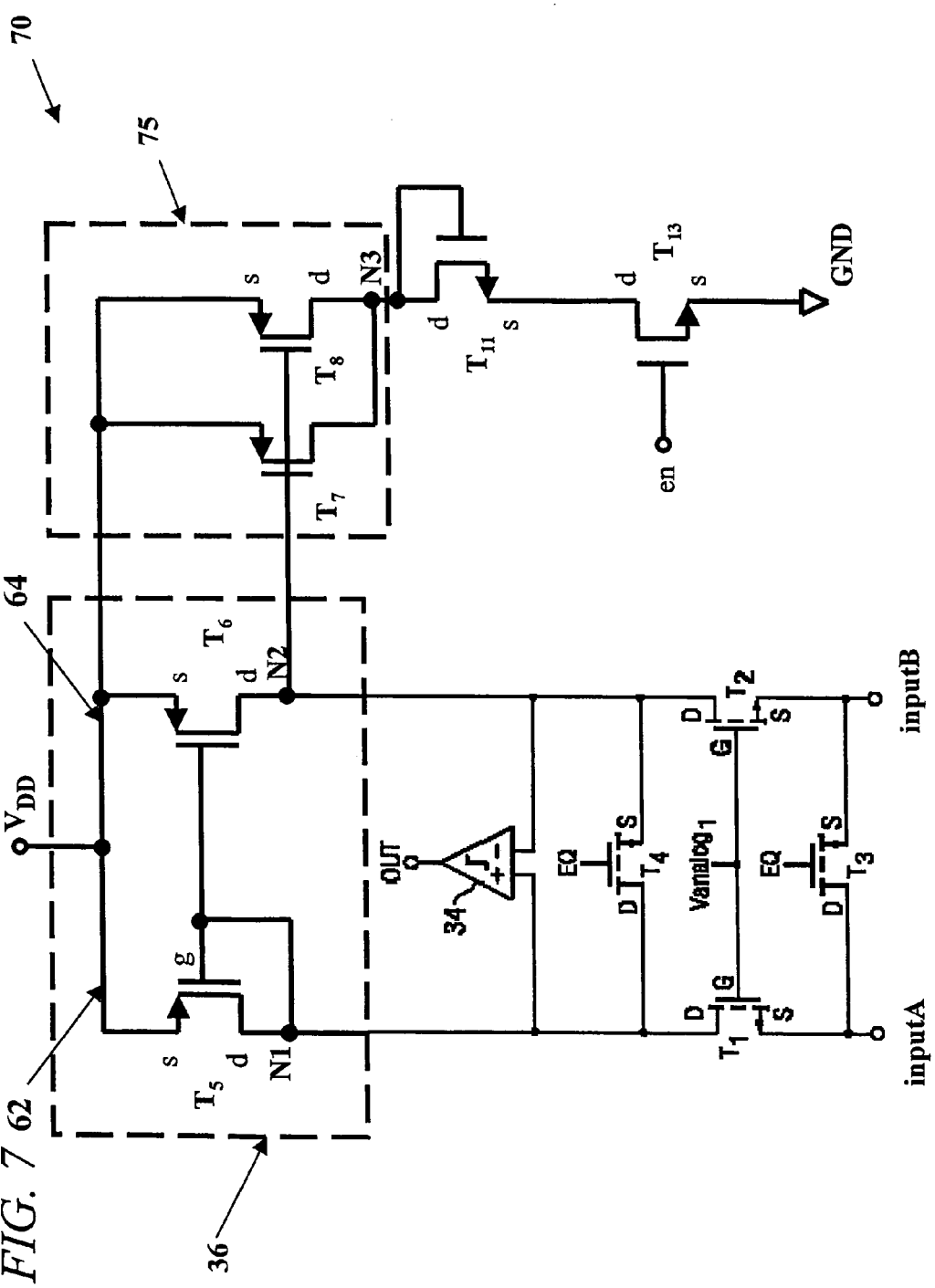
FIG. 7 shows a current sense amplifier in accordance with an embodiment of the present invention, including a current mirror with actively balanced capacitive load, bitline clamping devices, and a transistor diode circuit.

Turning now to FIG. 7, illustrated is a circuit diagram of a current sense amplifier 70 including an actively balanced capacitive load 75, constructed according to principles of the present invention. Components that are the same as those illustrated on FIG. 6 will not be re-described in the interest of brevity. The added actively balanced capacitive load 75 is included to match capacitance presented to the comparator 34 on sides 62 and 64 of the circuit. The actively balanced capacitive load 75 includes transistors $T_7$ and $T_8$. Transistors $T_7$ and $T_8$ are preferably substantially identical in size, geometry, type, and layout to transistors $T_5$ and $T_6$. Preferably, the transistors are proximally located on the same die. The sources of transistors $T_7$ and $T_8$ are coupled to the bias voltage source $V_{DD}$ and their gates are coupled to the drain of transistor $T_6$. In order to provide similar operating conditions in transistors $T_7$ and $T_8$ and transistors $T_5$ and $T_6$, the drains of transistors $T_7$ and $T_8$ are coupled to a potential that roughly matches an average potential of the drains of transistors $T_5$ and $T_6$. This is accomplished by including transistor $T_{11}$, arranged in a transistor diode configuration, in series with switch $T_{13}$. Switch $T_{13}$ is enabled to conduct by signal "en". Signal "en" is activated early enough before the sensing phase of the MTJ memory cell to permit the transistor diode device $T_{11}$ to conduct current during the measurement process when the associated circuit waveforms are sufficiently transient free.

As is well recognized in the art, parasitic capacitance associated with a semiconductor device may be dependent on voltage differences within the device. For example, a back-biased semiconductor junction may exhibit roughly a square root of voltage dependence of junction capacitance, depending on dopant grading. The internal structure of a FET includes back-biased semiconductor junctions. Thus the capacitance presented by a FET switch such as by its drain terminal would be expected to have a voltage-dependent component. The precise capacitance exhibited by a FET is dependent on manufacturing processes, which may vary from lot to lot, and on the operating temperature of the device. When switch $T_{13}$ is activated to conduct by the signal "en", (which can be set equal to $V_{DD}$ to enable switch conduction) the voltage at the node N3 is preferably about 900 mV, which is about half the bias voltage source, for example, 1.8 V, and is representative of an average drain voltage of transistors $T_5$ and T6. Ideally, the voltage at node N3 should be arranged to match the average operating conditions in transistors $T_5$ and $T_6$ so as to produce an equivalent capacitive load. But precision in matching an average operating condition in transistors $T_5$ and $T_6$ is not required for acceptably accurate capacitance matching with the circuit so as to substantially remove manufacturing and temperature-dependent variations of capacitance. Substantial transient matching can be achieved with the arrangement illustrated on FIG. 7 in which the drains of transistors $T_7$ and $T_8$ are coupled to a voltage that is roughly at the average potential of the drains of transistors $T_5$ and $T_6$. The operating point generation circuit including transistors $T_{11}$ and $T_{13}$ can be replaced by any circuit creating an approximating operating voltage at the node N3 so as to establish a proper operating condition in the transistors $T_7$ and $T_8$ thereby providing the proper added parasitic capacitance to balance, without adjustment, the capacitive inputs of the voltage comparator. Thus what has been described is a circuit that is insensitive, for example, to manufacturing process and temperature-dependent variations that provides substantially matched capacitive loads at the inputs of the voltage comparator by including substantially similar components with substantially similar capacitance produced by similar operating conditions.

Figure 8:
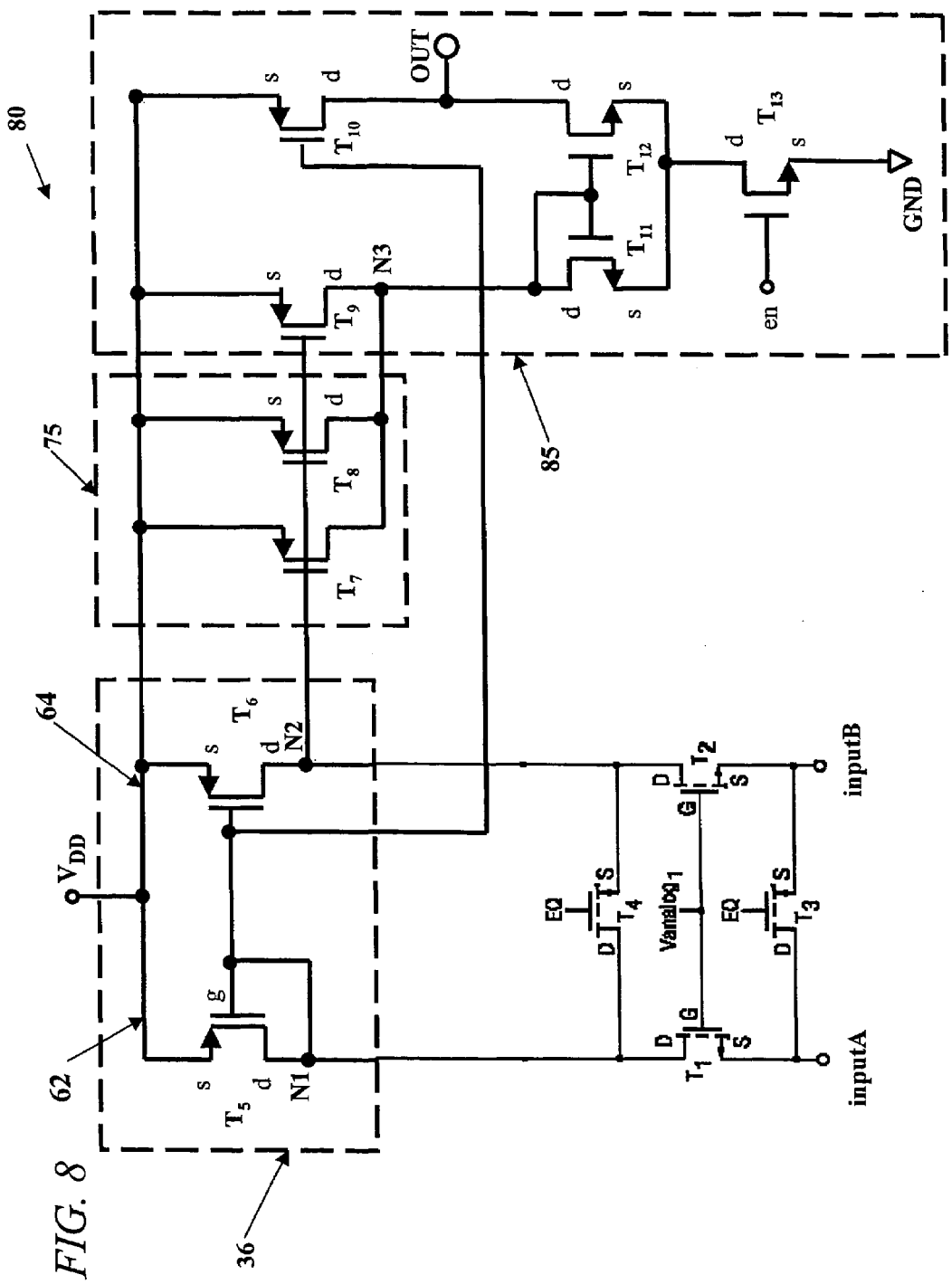
FIG. 8 shows a current sense amplifier in accordance with an embodiment of the present invention including a current mirror with actively balanced capacitive load, bitline clamping devices, and an integrated voltage comparator with voltage sensing transistors and output-driving current mirror.

Turning now to FIG. 8, illustrated is a circuit diagram of a current sense amplifier 80 including an actively balanced capacitive load 75 combined with a voltage comparator 85, constructed according to principles of the present invention. Components that are the same as those illustrated on FIGS. 6 and 7 will not be re-described, again in the interest of brevity. The circuit illustrated on FIG. 8 combines the functions of the actively balanced capacitive load 75 with the voltage comparator 85. In FIG. 8, the voltage comparator 34 that was described with reference to FIG. 6 has been replaced by the voltage comparator 85. Capacitance balancing transistors $T_7$ and $T_8$, and voltage sensing transistor $T_9$ have their gates connected to node N2 to achieve the capacitance balancing function, and the drains of transistors $T_7$ and $T_8$ are connected to the drain of transistor $T_9$. As illustrated in FIG. 8, transistors $T_7$, $T_8$ and $T_9$ are coupled in parallel. It is recognized that transistors $T_7$, $T_8$ and $T_9$ can be combined into one or two or more transistors, with appropriately scaled areas, to achieve the same capacitance balancing effect with the circuit, and that the identification of transistors $T_7$, $T_8$ and $T_9$ is not unique in the sense that the three are coupled in parallel. The transistors have been identified separately to clarify the explanation of the circuit. During the MTJ cell logic state sensing process, transistors $T_1$, $T_2$, $T_5$ and $T_6$ create a voltage difference between nodes N1 and N2 that represents the memory state of the MTJ represented by the difference in input currents at inputA and inputB. This voltage difference is coupled to transistors $T_7$, T8 and $T_9$ at node N2, and to transistor $T_{10}$ at node N1. The drain-to-source current flowing through transistors $T_7$, $T_8$ and $T_9$ and combined at node N3 is mirrored to transistor $T_{10}$ by means of the current mirror formed by transistors $T_{11}$ and $T_{12}$. The high sensitivity of the drain voltage of transistor $T_{10}$ to small changes in its gate voltage results in substantial voltage changes at the output node "OUT" resulting from small differences in sensed current supplied to the inputs inputA and inputB.

Transistor $T_{11}$ is sized so that the voltage at node N3 approximates the operating point voltage of nodes N1 and N2. The sizing can be performed using a circuit and device simulation program such as HSPICE®. A typical voltage at node N3 is about 900 mV for a 1.8 V bias source voltage $V_{DD}$. Thus, transistors $T_7$, $T_8$ and $T_9$ can be configured in size, geometry, and operating point so that the capacitance at node N2 accurately balances, without the need for adjustment, the capacitance at node N1, independently of, for example, manufacturing process variations or operating temperature variations of the circuit. Because transistors $T_7$, $T_8$ and $T_9$ collectively inject current into the differential voltage comparator stage comprising voltage sensing transistors $T_9$ and $T_{10}$ and the current-mirror transistors $T_{11}$ and $T_{12}$, the transistors $T_{11}$ and $T_{12}$ must be sized to allow current comparison of the current from transistor $T_{10}$ and the current from the paralleled transistors $T_7$, $T_8$ and $T_9$. As is well understood in the art, the controlled current from a current mirror can be scaled according to the ratio of the areas of the respective transistors. Transistor $T_{13}$, coupled to the signal "en" as previously described hereinabove with reference to FIG. 7, enables the operation of the voltage comparator 85. Thus, what has been described is a circuit that combines the active capacitance balancing function with the voltage comparison function, providing opportunities for simplification in the layout of an integrated circuit while retaining substantially matched transient characteristics.

Figure 9:
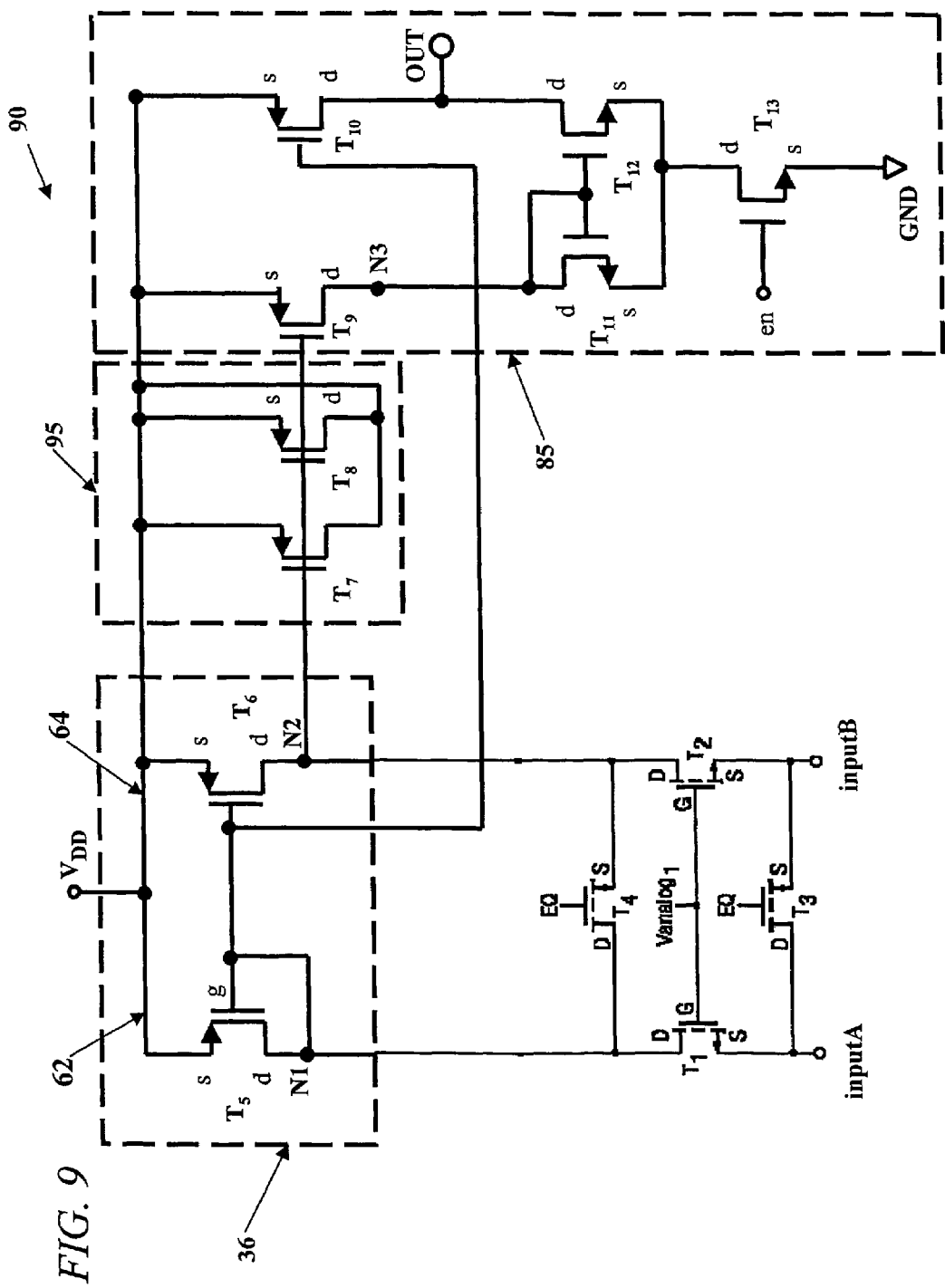
FIG. 9 illustrates an embodiment of the present invention including a current mirror with an actively balanced capacitive load combined with an integrated voltage comparator with voltage sensing transistors and output-driving current mirror.

Turning now to FIG. 9, illustrated is a circuit diagram of a current sense amplifier 90 including an actively balanced capacitive load 95 combined with a voltage comparator 85, constructed according to principles of the present invention. Components that are the same as those illustrated on FIGS. 6 and 7 will not be re-described, again in the interest of brevity. The voltage comparison function utilizing voltage comparator 85 described with reference to FIG. 8 is included in the circuit illustrated on FIG. 9. Transistors $T_7$ and $T_8$, which are coupled in parallel, have their drains connected to node $V_{DD}$ rather than an active node such as N3 to achieve the active capacitance balancing function. Although the transistors $T_7$ and $T_8$ do not match the operating conditions of transistors $T_5$ and $T_6$, the size and layout of transistors T7 and $T_8$ can be fixed so that substantial capacitance balancing occurs in the circuit despite changes, for example, in a manufacturing process or in circuit operating temperature. The optimal size and layout of transistors $T_7$ and $T_8$ that minimizes the sensitivity to such changes can be determined by circuit and device simulation using a circuit and device program such as HSPICE®. Thus, what has been described is a circuit that combines the active capacitance balancing function with the voltage comparison function, providing opportunities for simplification in the layout of an integrated circuit while retaining substantially matched transient characteristics.

Although embodiments of the present invention and its advantages have been described in detail, it should be understood that various changes, substitutions and alterations can be made herein without departing from the spirit and scope of the invention as defined by the appended claims.

What is claimed is:

1. A current sense amplifier, comprising:
 a voltage comparator having a first input, a second input and an output;
 a first clamping device coupled between the first input of the voltage comparator and a first input signal node, the first clamping device being coupled to a reference voltage;
 a second clamping device coupled between the second input of the voltage comparator and a second input signal node, the second clamping device being coupled to the reference voltage;
 a current mirror having a first side and a second side, the current mirror first side including a first transistor coupled between a voltage source and the first clamping device and the current mirror second side including a second transistor coupled between the voltage source and the second clamping device, the first and second transistors including sources, gates and drains, wherein the gates of the first and second transistors are coupled together, and the gate and drain of the first transistor are coupled together; and a sensing scheme including an actively balanced capacitance coupled to the source and drain of the second transistor, wherein the actively balanced capacitance includes a third transistor with a source, gate and drain, the source and gate of the third transistor being coupled to the source and drain of the second transistor, and the drain of the third transistor being coupled to a drain node to actively balance capacitive loads of the current mirror.

2. The current sense amplifier according to claim 1, wherein the drain node is coupled to a voltage source with a voltage different from the source terminal of the third transistor to actively balance capacitive loads of the current mirror.

3. The current sense amplifier according to claim 1, further comprising an equalizing transistor coupled between the first input and the second input of the voltage comparator.

4. The current sense amplifier according to claim 1, further comprising an equalizing transistor coupled between the first input signal node and the second input signal node.

5. The current sense amplifier according to claim 2, wherein the drain node is coupled to a fourth transistor configured as a transistor diode.

6. The current sense amplifier according to claim 5, wherein a switch is coupled in series to the fourth transistor, and wherein a current is enabled to flow through the fourth transistor by the switch enabled to conduct before a current sensing phase.

7. The current sense amplifier according to claim 1, wherein one of the first input signal node or the second input signal node conducts a reference current of at least one reference cell, wherein the other of the first input signal node or the second input signal node conducts a current from a selected memory cell being read, and wherein the voltage comparator outputs a logic state related to a logic state of the selected memory cell.

8. The current sense amplifier according to claim 7, wherein a reference current conducted at the first input signal node or the second input signal node comprises an averaged current from at least two reference cells.

9. The current sense amplifier according to claim 1, wherein the first input signal node conducts a current from a selected memory cell or a current from a memory cell configured to store the opposite logic state of the selected memory cell, and the second input signal node conducts the current from the memory cell configured to store the opposite logic state of the selected memory cell or the current from the selected memory cell.

10. A current sense amplifier comprising:

a voltage comparator combined with an actively balanced capacitive load, having an output and a first input and a second input, the first and second inputs comprising two voltage sensing transistors scaled to balance the capacitive loads of an input sensing current mirror, the input sensing current mirror having a first side and a second side, the two voltage sensing transistors each having a gate, a gate of the first voltage sensing transistor being coupled to a side of the input sensing current mirror, and a gate of the second voltage sensing transistor being coupled to another side of the input sensing current mirror;

the voltage comparator further including two transistors configured as an output-driving current mirror coupled to the two voltage sensing transistors;

a first clamping device coupled between the first input of the voltage comparator and a first input signal node, the first clamping device being coupled to a reference voltage;

a second clamping device coupled between the second input of the voltage comparator and a second input signal node, the second clamping device being coupled to the reference voltage;

the input sensing current mirror first side including a first input sensing current mirror transistor coupled between a voltage source and the first clamping device and the input sensing current mirror second side including a second input sensing current mirror transistor coupled between the voltage source and the second clamping device, the first and second input sensing current mirror transistors each having a source, a gate, and a drain, the gates being coupled together and the gate and drain of the first input sensing current mirror transistor being coupled together; and the two transistors configured as an output-driving current mirror scaled to provide an operating condition for the voltage sensing transistors that approximates an operating condition of the first or second input sensing current mirror transistors comprising the input sensing current mirror.

11. The current sense amplifier according to claim 10 wherein the operating condition is drain-to-source voltage.

12. The current sense amplifier according to claim 10, further comprising an equalizing transistor coupled between the inputs of the voltage comparator.

13. The current sense amplifier according to claim 10, further comprising an equalizing transistor coupled between the first input signal node and the second input signal node.

14. The current sense amplifier according to claim 10, wherein one input signal node conducts a reference current of at least one reference cell, wherein the other input signal node conducts a current from a selected memory cell being read, and wherein the voltage comparator outputs a logic state related to a logic state of the selected memory cell.

15. The current sense amplifier according to claim 14, wherein the reference current comprises an averaged current from at least two reference cells.

16. The current sense amplifier according to claim 10, wherein the first input signal node conducts a current from a selected memory cell or current from a memory cell configured to store the opposite logic state of the selected memory cell, and the second input signal node conducts the current from the memory cell configured to store the opposite logic state of the selected memory cell or the current from the selected memory cell.

17. The current sense amplifier according to claim 10, wherein a current is enabled to flow through the two transistors configured as an output-driving current mirror by a series switch enabled to conduct before a current sensing phase.

18. A memory device, comprising:

an array of memory cells, the memory cells having a first side and a second side, wherein at least two of the memory cells comprise reference cells;

a plurality of parallel wordlines coupled proximate the first side of the memory cells, the wordlines running in a first direction;

a plurality of parallel bitlines coupled proximate the second side of the memory cells; and a sensing circuit including at least one column selector and at least one current sense amplifier, the at least one column selector being coupled to the memory array and comprising at least one column select transistor coupled to each bitline in the array, the at least one current sense amplifier including a voltage comparator, a first clamping device, a second clamping device, and a current mirror having a first side and a second side, wherein the voltage comparator includes a first input, a second input and an output, wherein a first input signal node is coupled to the voltage comparator first input, wherein a second input signal node is coupled to the voltage comparator second input, the first and second input signal nodes conducting either current from a selected memory cell or current from at least one reference cell, wherein the voltage comparator outputs a logic state related to a logic state of the selected memory cell, wherein the current mirror includes a first transistor coupled between a voltage source and the first clamping device and the current mirror second side includes a second transistor coupled between the voltage source and the second clamping device, the first and second transistor gates being coupled together, the gate and drain of the first transistor being coupled together, wherein an active capacitance balancing circuit including a third transistor, the source and gate of the third transistor coupled to the source and drain of the second transistor of the current mirror, and wherein the drain of the third transistor is coupled to a drain node to actively balance capacitive loads of the current mirror.

19. The memory device according to claim 18, wherein the drain node is coupled a voltage source with a voltage different from the source terminal of the third transistor to actively balance capacitive loads of the current mirror.

20. The memory device according to claim 18, wherein the first clamping device is coupled between the first input of the voltage comparator and the first input signal node, the first clamping device being coupled to a reference voltage, wherein the second clamping device is coupled between the second input of the voltage comparator and the second input signal node, the second clamping device being coupled to the reference voltage, and wherein the current mirror is coupled between the first and second input of the voltage comparator.

21. The memory device according to claim 18, wherein the current sense amplifier further comprises:

a first equalizing transistor coupled between the first input and second input of the voltage comparator; and a second equalizing transistor coupled between the first input signal node and the second input signal node.

22. The memory device according to claim 18, wherein the memory cells comprise magnetic tunnel junctions, wherein the memory device comprises a magnetic random access memory (MRAM) device.

23. A method of sensing current, comprising:

providing a first input signal node having a first voltage and conducting a first current;

clamping the first voltage and passing the first current to a first transistor, the first transistor having a drain terminal;

providing a second input signal node having a second voltage and conducting a second current;

clamping the second voltage and passing the second current to a second transistor, the second transistor having a drain terminal;

configuring either the first transistor to mirror the first current to the second transistor, or the second transistor to mirror the second current to the first transistor;

actively balancing the capacitive loads across the drains of the first transistor and the second transistor with a third transistor scaled to at least the first or second transistor, a drain terminal of the third transistor being coupled to a drain node, wherein by coupling an electrical potential to the drain node an operating condition is established for the third transistor such that the capacitive loads across the drains of the first transistor and the second transistor are actively balanced; and comparing the voltage across the first or second transistor to the voltage across the second or first transistor, wherein the mirrored current causes the voltage difference between the voltage across the first transistor and the voltage across the second transistor to be amplified.

24. The method according to claim 23, wherein the first input signal node and second input signal node conduct either current from a selected memory cell or a current from at least one reference cell.

25. The method according to claim 23, wherein the first input signal node conducts a current from a selected memory cell or a current from a memory cell configured to store the opposite logic state of the selected memory cell, and the second input signal node conducts the current from the memory cell configured to store the opposite logic state of the selected memory cell or the current from the selected memory cell.

26. The method according to claim 23, wherein actively balancing the capacitive loads includes providing an approximate operating condition in the scaled transistor corresponding to an operating condition in the devices mirroring the current.

27. The method according to claim 26, wherein the operating condition is a drain-to-source voltage.

28. The method according to claim 23, wherein the first transistor and second transistor voltage difference indicates a resistive state of the selected memory cell.

* * * * *